(12) United States Patent
Grigsby

(10) Patent No.: US 11,974,396 B2
(45) Date of Patent: Apr. 30, 2024

(54) SYSTEMS USING COMPOSITE MATERIALS

(71) Applicant: Advanced American Technologies, LLC, Huntsville, AL (US)

(72) Inventor: Robert E. Grigsby, Owens Cross Roads, AL (US)

(73) Assignee: Advanced American Technologies, LLC, Huntsville, AL (US)

( * ) Notice: Subject to any disclaimer, the term of this patent is extended or adjusted under 35 U.S.C. 154(b) by 0 days.

(21) Appl. No.: 17/074,086

(22) Filed: Oct. 19, 2020

(65) Prior Publication Data
US 2021/0392748 A1 Dec. 16, 2021

Related U.S. Application Data

(60) Provisional application No. 62/978,123, filed on Feb. 18, 2020.

(51) Int. Cl.
  *H05K 1/03* (2006.01)
  *H05K 1/02* (2006.01)
  *H05K 1/18* (2006.01)

(52) U.S. Cl.
  CPC ......... *H05K 1/0353* (2013.01); *H05K 1/0203* (2013.01); *H05K 1/0275* (2013.01); *H05K 1/181* (2013.01); *H05K 2201/07* (2013.01)

(58) Field of Classification Search
  CPC .. H05K 1/0353; H05K 1/0203; H05K 1/0275; H05K 1/181; H05K 2201/07
  See application file for complete search history.

(56) References Cited

U.S. PATENT DOCUMENTS

| | | | | |
|---|---|---|---|---|
| 2003/0066672 A1* | 4/2003 | Watchko | ............. | H05K 9/0045 174/50 |
| 2004/0046252 A1* | 3/2004 | Fujimori | ............. | H05K 3/3485 257/734 |
| 2005/0095410 A1* | 5/2005 | Mazurkiewicz | ..... | H05K 9/0039 428/209 |
| 2006/0272150 A1* | 12/2006 | Eguchi | ................... | H05K 3/284 29/841 |
| 2006/0284304 A1* | 12/2006 | Caletka | ............. | H01L 23/3128 257/700 |
| 2008/0298023 A1* | 12/2008 | Okimoto | ................ | H05K 1/186 361/715 |
| 2011/0299288 A1* | 12/2011 | Rapisarda | ........... | H05K 1/0203 362/311.02 |
| 2012/0178329 A1* | 7/2012 | Kochi | .................... | C08K 5/435 442/205 |
| 2012/0281360 A1* | 11/2012 | Nicol | ..................... | G16H 20/10 361/704 |
| 2014/0002998 A1* | 1/2014 | Pidwerbecki | ......... | G06F 1/1656 361/717 |
| 2014/0190930 A1* | 7/2014 | Mayo | .................... | H05K 3/284 216/13 |
| 2014/0268579 A1* | 9/2014 | Nguyen | ............... | H01L 23/427 361/719 |

(Continued)

*Primary Examiner* — Michael A Matey
(74) *Attorney, Agent, or Firm* — Dennen IP Law, LLC

(57) ABSTRACT

A system has a printed circuit board (PCB) comprising one or more electrical and/or electronic components and a composite material comprising highly-complex resin systems and thermally-resistant solids, the composite material adhered to the PCB and encasing the one or more electrical or electronic components.

15 Claims, 7 Drawing Sheets

(56) References Cited

U.S. PATENT DOCUMENTS

| | | | | |
|---|---|---|---|---|
| 2014/0334109 A1* | 11/2014 | Takagi | ................... | H05K 1/181 |
| | | | | 361/728 |
| 2017/0309576 A1* | 10/2017 | Kawabata | ................ | H01L 25/50 |
| 2017/0345730 A1* | 11/2017 | Tomida | ................. | C08L 101/12 |
| 2018/0158782 A1* | 6/2018 | Kawabata | ................ | H01L 24/95 |
| 2018/0336376 A1* | 11/2018 | Pavageau | ............. | G06K 7/0078 |
| 2019/0344483 A1* | 11/2019 | Okuhira | ............. | C08G 18/7671 |
| 2019/0344514 A1* | 11/2019 | Wakeham | ............. | B29C 70/882 |
| 2020/0359534 A1* | 11/2020 | Perry | ..................... | H05K 9/003 |

\* cited by examiner

SYSTEMS USING COMPOSITE MATERIALS

CROSS REFERENCE TO RELATED APPLICATION

This application claims priority to U.S. Provisional Patent Application 62/978,123 entitled Composite Material and Use Thereof filed Feb. 18, 2020, which is incorporated herein by reference.

BACKGROUND

A printed circuit board (PCB) is a mechanical device that supports electrical or electronic components that are electrically connected to and mechanically fasten to the PCB. The PCB electrically connects the components using conductive tracks, pads and/or other features etched in one or more sheet layers of copper laminated onto and/or between sheet layers of a non-conductive substrate.

Many PCBs experience high power densities, which is based on the type and number of electrical or electronic components mechanically affixed and electrically coupled to the PCB. High power densities lead to high temperatures on the PCB. High temperatures can affect the operation of the components on the PCB negatively. The high temperatures may affect the performance of the components or make the components inoperable. In this regard, the high temperatures may lead to mechanical stress, which causes cracking and connection failures.

BRIEF DESCRIPTION OF THE FIGURES

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure describes a composite material and a method of using the composite material to control the thermal behavior of a printed circuit board (PCB). The composite material is comprised of highly complex resin systems and thermally resistant solids. The highly complex resin systems and the thermally resistant solids are mixed in a chamber at ambient temperature to produce the composite material. The composite material is placed in vacuum mixer to remove excess oxygen from the composite material. The composite material is heated.

The heated composite material is poured into a frame housing the PCB. In this regard, the composite material is layered over the PCB to cover one or more of the electrical and electronic components.

In operation, the composite material tends to alter the thermal dissipation of the PCB, thereby decreasing operating temperatures of the PCB. Thus, the risk of damage to the electrical or electronic components is reduced. In addition, a heat sink may be coupled to the PCB and molded into the composite material. When the heat sink is molded into the composite material, the heat generated by the PCB follows the path of least resistance guided by the composite material due to the composite material's insulative factors and out the heat sink. Additionally, the composite material, due to its unique make up transitions from insulator to heat conductor. Due to the increased surface area it reduces the operating temperatures of the PCB and other electrical and electronic components. Thus, the composite material provides anti-intrusion and anti-corrosion properties to the PCB. Further, the composite material provides anti-vibration properties by securing the electrical or electronic components of the PCB.

Figure 1:
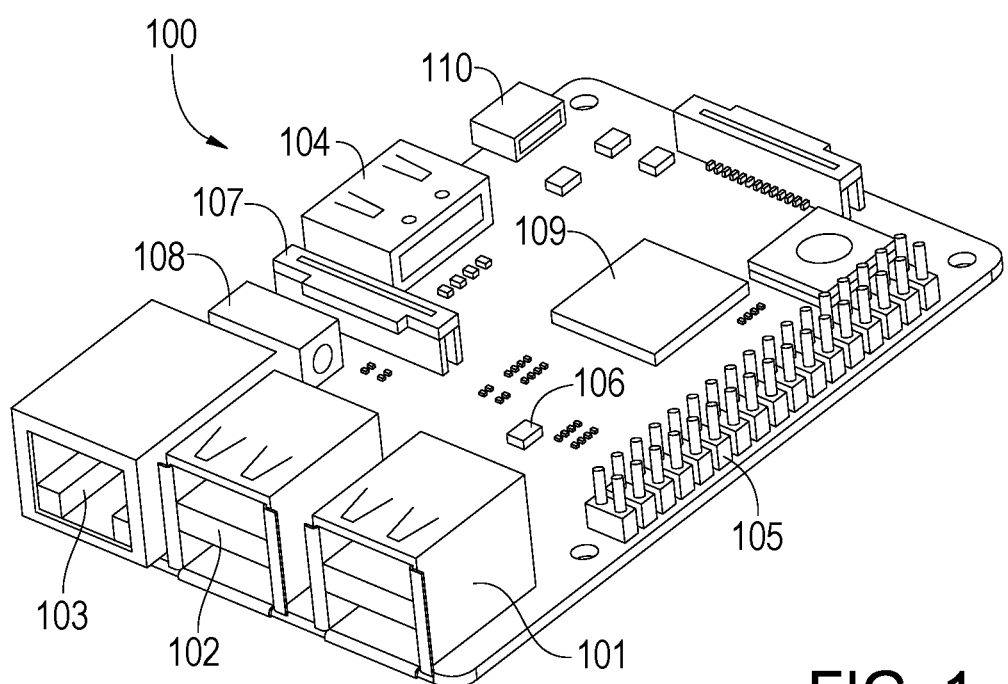
FIG. 1 is a printed circuit board (PCB) showing various electrical and electronic components affixed thereto.

FIG. 1 is the printed circuit board (PCB) 100. The PCB 100 comprises a plurality 104-110, including electrical and electronic components. Note that the number and type of electrical and/or electronic components may vary in other embodiments of the present disclosure. The PCB further comprises one or more input/output (I/O) ports 101-103. Note that the number and type of I/O ports may vary in other embodiments of the present disclosure. In this regard, the make-up of the PCB regarding electrical and/or electronic components and I/O ports is irrelevant to the present disclosure.

When the PCB 100 is operating, the electrical and electronic components produce heat related to power losses and environmental factors. Processor chips are heat-limited to the speed at which they run. If left unchecked, the heat produced may cause damage to the electric and electronic components. The lack of any conformal coating can result in the PCB 100 being inoperable by causing intrusion, corrosion, and vibration. In the PCB 100, the heat dissipates throughout the PCB 100 so that all the electrical and electronic components on the PCB 100 are negatively affected.

Figure 2:
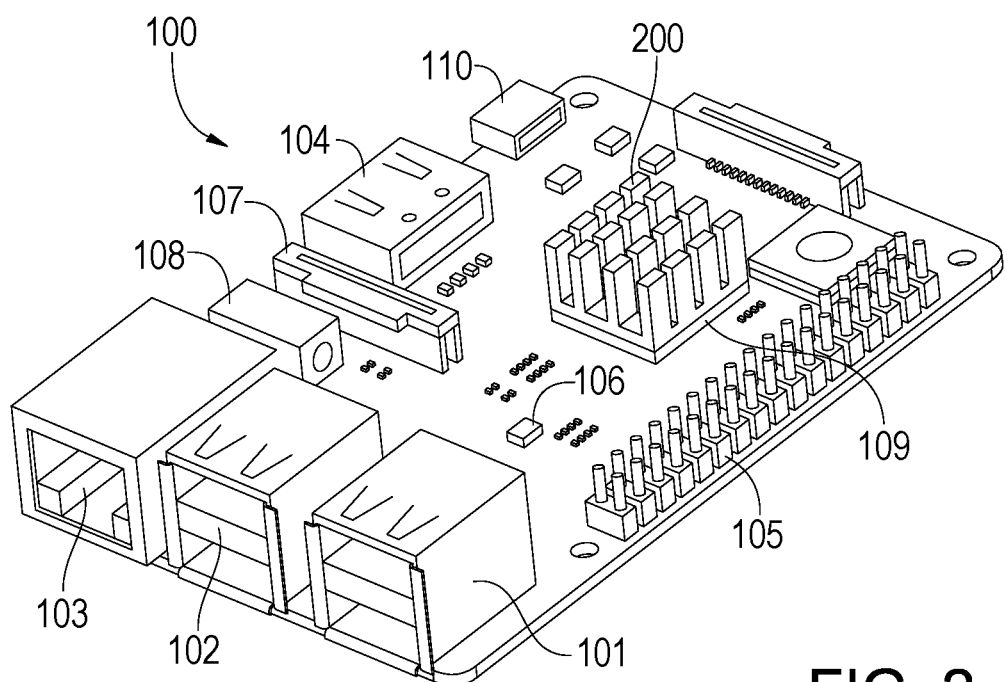
FIG. 2 the PCB of FIG. 1 with a heat sink attached thereto.

FIG. 2 is the PCB 100 in accordance with an embodiment of the present disclosure. The PCB 100 comprises the plurality of electric and/or electronic components 104-110 (FIG. 1). In addition, the PCB comprises a heat sink 200 coupled to electronic component 109. The heat sink 200 is constructed and attached to the PCB 100 such that the heat sink 200 passively transfers heat generated by the PCB 100 away from the PCB 100 and to the air, where it is dissipated away from the PCB. In this regard, the heat sink 200 regulates the PCB's temperature to a limited level. Even with the heat sink 200, heat is still generated and affects the operation of the electric and/or electronic components on the PCB 100. As the PCB is exposed in all directions to ambient air temperature conditions the amount of heat dissipated by heat sink 200 is limited and can only reduce the operating temperature of 109 and various other electronic and electronic components by a limited amount. Given these conditions the chip operating speed must be limited to prevent damage to electronic and electrical components.

Figure 3:
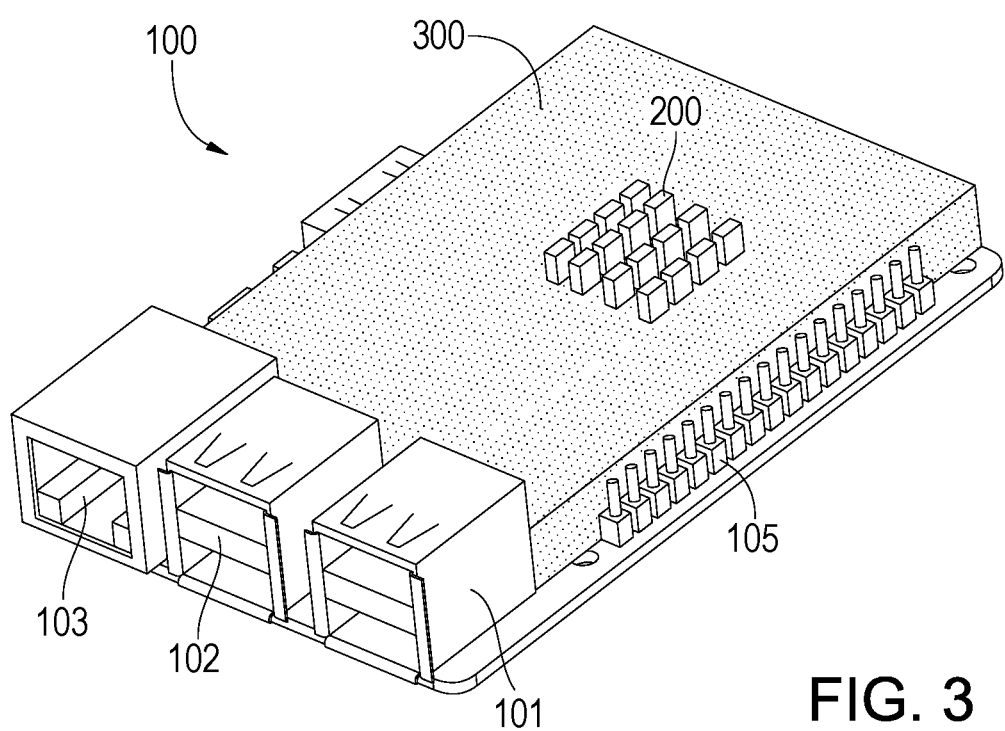
FIG. 3 the PCB of FIG. 2 coated with a composite material in accordance with an embodiment of the present disclosure.

FIG. 3 is the PCB 100 showing the heat sink 200 attached thereto. In addition, a composite material 300 is applied directly to the PCB 100 and encases the electrical and electronic components 104-110 (FIG. 1) on the PCB 100. Note that in one embodiment, the composite material 300 is of a consistency such that the composite material 300 can is poured onto the PCB 100. When the composite material 300 hardens, it encases the electrical and electronic components 104-110 (FIG. 1) on the PCB 100.

In operation, the PCB 100 produces heat, as described above. However, the heat is not dissipated throughout the PCB 100. Instead, the heat generated follows via a path of least resistance guided by the composite material 300 and out into the air away from the PCB 100 via the heat sink 200.

The composite material 300 is comprised of highly-complex resin systems. For example, the resin systems may comprise epoxies, polyester, polyurethane, and/or silicone. Notably, the resin used to coat the electrical and/or electronic components is configured to protect the PCB 100 from intrusion, corrosion, and vibration. The composite material 300 further comprises thermally-resistant solids.

The composite material 300 is lightweight compared to steel and aluminum. In this regard, the composite material is lightweight. Further, it provides protection from radiation. Also, it provides thermal protection and corrosion resistance. The composite material 300 also provides electrical isolation properties, toughness, and ease of application, which is described further herein. Also, the composite material makes electronics run cooler while providing tamper resistance. Note that these properties are tunable for different behavior.

As will be described further herein, the composite material can be poured directly onto electrical and/or electronic components 104-110 (FIG. 1). The composite material 300 is also electrically non-conductive and bonds directly to any substrate. The temperature of the composite material, when applied to the PCB is not elevated enough to cause damage to the PCB or electronic and electrical components. Note that in some embodiments the composite material may be made conductive if the application requires. The following table outlines the properties of the composite material:

Once the composite material 300 is created, it is heated. Heating the composite material gives the composite material 300 a low viscosity consistency. Once heated, it is poured on the PCB 100, which is described further herein.

Figure 6:
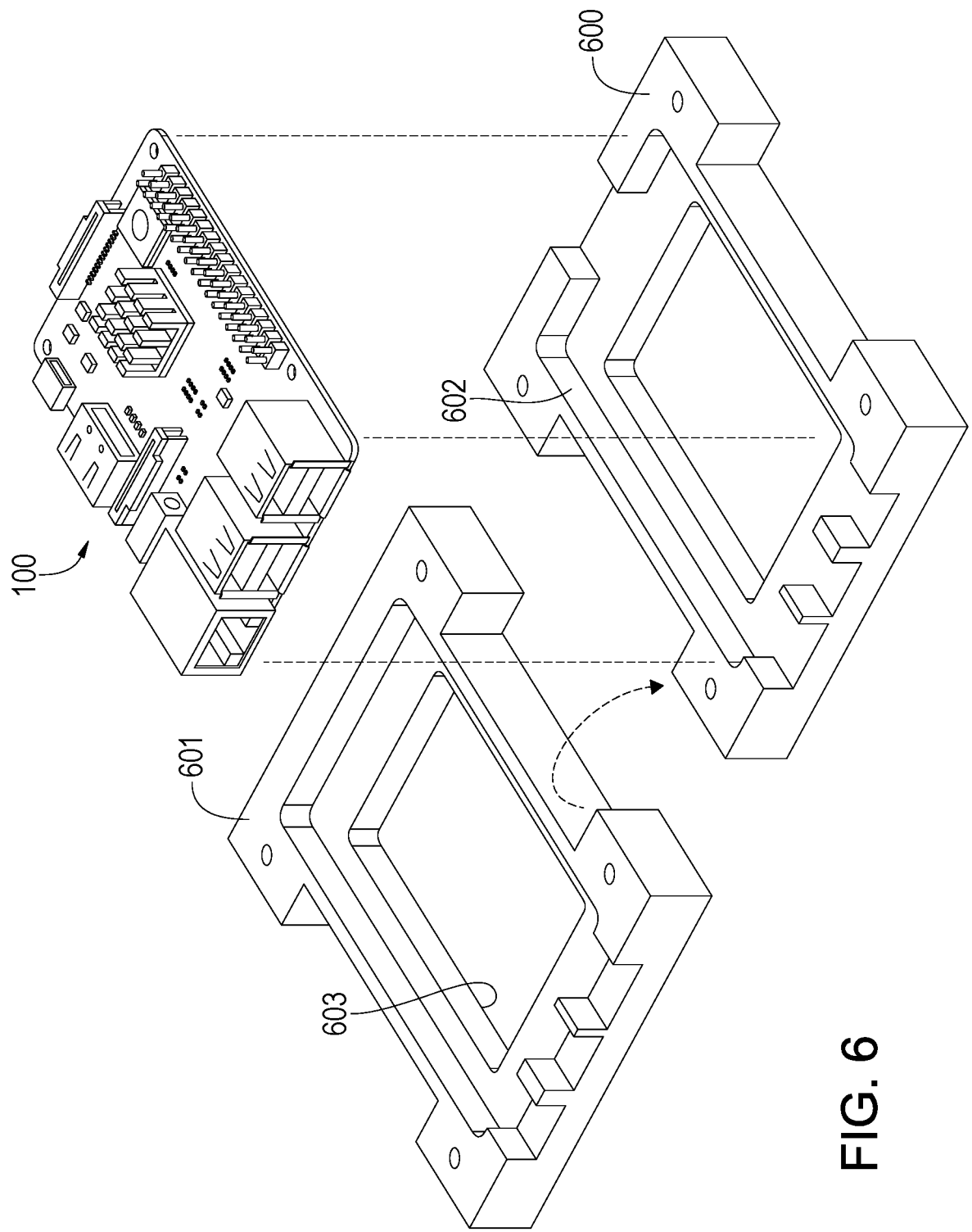
FIG. 6 is a molding frame showing the PCB relative to its placement in the molding frame.

FIG. 6 depicts the construction of a PCB 100 comprising the composite material 300 (FIG. 3). In this regard, construction of the PCB 100 uses a top frame 601 and a bottom frame 600. The bottom frame is constructed such that it comprises a cavity 602 that is shaped to receive the PCB 100. The PCB 100 is placed into the cavity 602. The top frame 601 is placed atop the bottom frame 600.

Once the top frame 601 is placed atop the bottom frame 600, the heated composite material 300 is poured through the opening 603 in the top frame 601. The composite material 300 is allowed to cure.

Figure 7:
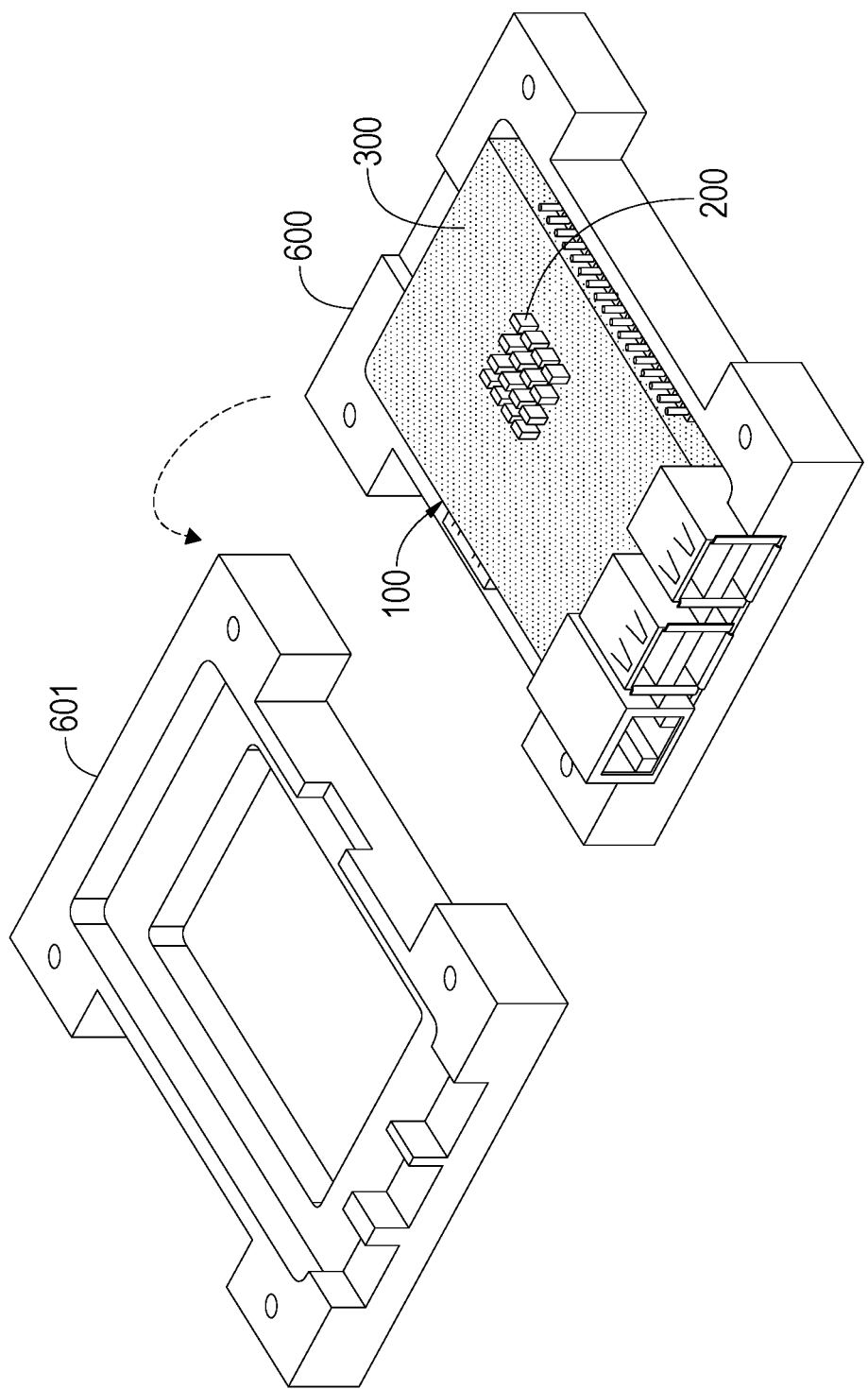
FIG. 7 is the molding frame showing the PCB comprising a composite material adhered thereto.

FIG. 7 shows the PCB 100 removably coupled to the bottom frame 600. The top frame 601 has been removed from the bottom frame 600 after the composite material is allowed to set. The composite material 300 covers the electrical and/or electronic components 104-110 (FIG. 1).

Once the top frame 601 has been removed from the bottom frame 600, one can remove the PCB 100 from the bottom frame 600. The resulting PCB 100 comprises the composite material covering a plurality of electrical and electronic components 104-110, on the PCB 100. Note that the composite material may encase one or more of the electrical and/or electronic components 104-110 on the PCB 100 but not 200.

Note that the speed of a processor on the PCB 100 is limited by heat. The encasing of the electrical and/or electronic 104-110 in the composite material 300 permits higher processing speeds and/or operations in higher environmental

TABLE 1

| Weight: | Chemical and Oil Sensitivity: |
|---|---|
| None | |
| 40% lighter than aluminum | Corrosion: Non-Corroding |
| 80% lighter than Invar Steel ° F. | Coefficient of Thermal Exp: $24.1 \times 10^6$ in/in |
| 85% lighter than lead (Pb) | Flammability: Fire Resistant |
| Density: 10.68 ppg | Flexural Modulus @ 72° F.: $.42 \times 106$ psi |
| Weight: 102. lb/cuft | Hardness, Shore "D" @ 72° F.: 90 |
| Thermal Conductivity: | Tensile Elongation @ break: 2.7% |
| Standard −1.25 W/m-k | Flexural Strength @ 72° F.: 12,700 psi |
| Plus - 0.4 W/m-k | Max Operating Temperature: 425° F. |
| Tensile Strength: 7,200 psi | |

The key advantages of the composite material 300 is that the composite material is recyclable/reusable, can produce near-net parts, has additive manufacturing applications, is lightweight, reduces machining cost, is flame resistance, self-extinguishing, and eco-friendly.

Figure 4:
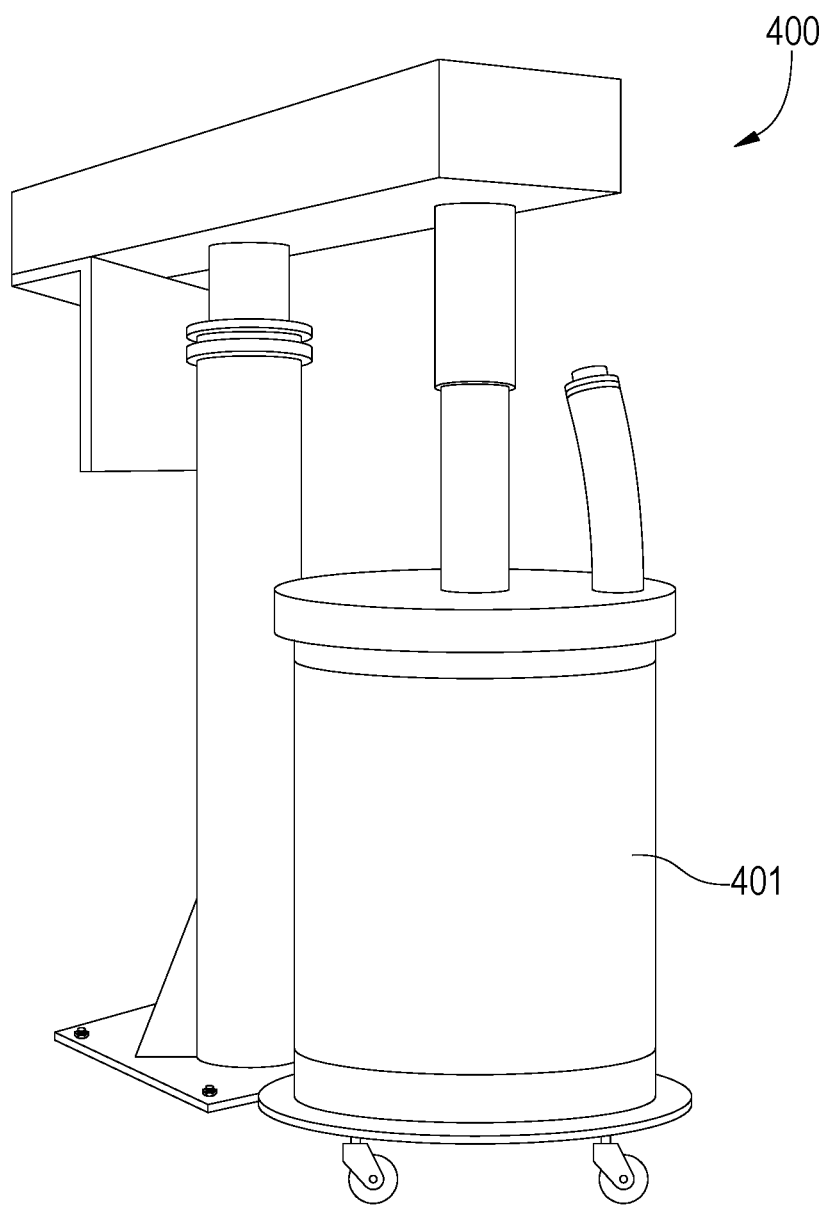
FIG. 4 is an industrial mixer.

FIG. 4 is an industrial mixer 400. The industrial mixer 400 comprises a chamber 401. To create the composite material 300 (FIG. 3), the highly complex resin systems and the thermally resistant solids are mixed in the chamber 401 to create a mixture. Note that the industrial mixture 400 is shown for exemplary purposes only; other types of mixers may be used to generate the mixture in other embodiments.

Figure 5:
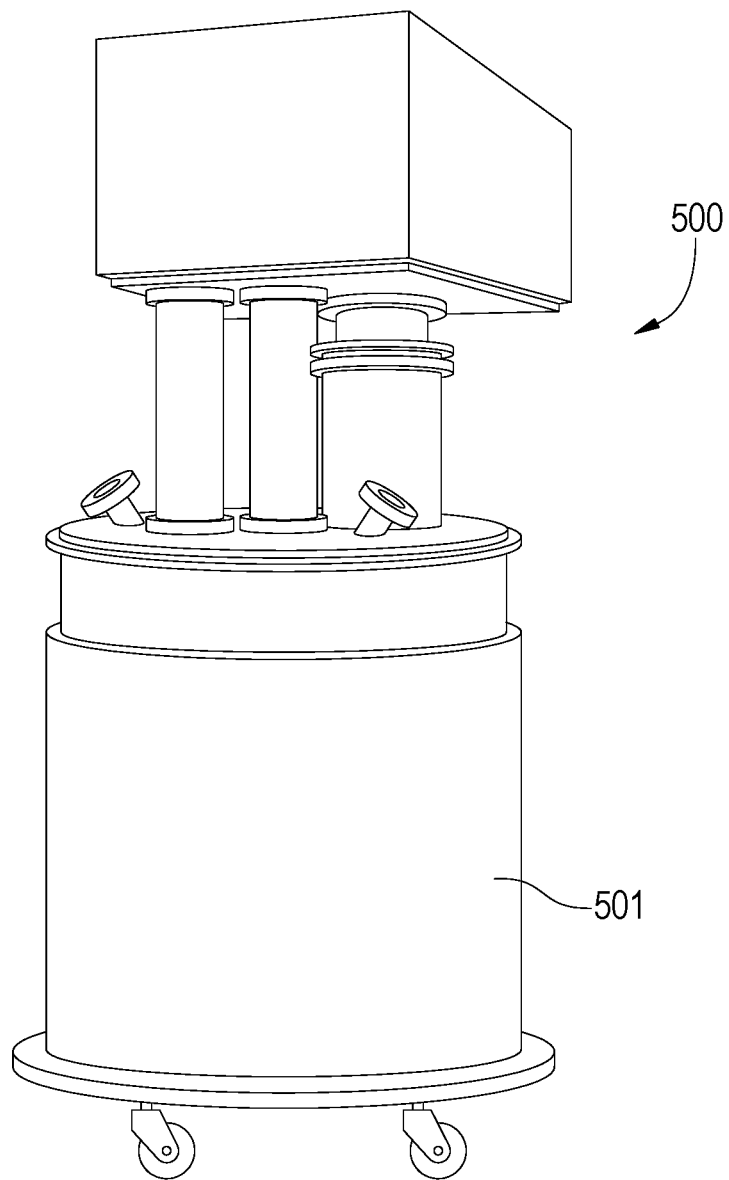
FIG. 5 is industrial vacuum mixer.

FIG. 5 is an exemplary vacuum degas mixer 500. The vacuum degas mixer 500 comprises a chamber 501. The mixture created in the industrial mixer 400 (FIG. 4) is placed in the chamber 501 of the vacuum mixer 500. The vacuum degas mixer 500 removes excess oxygen in the mixture to obtain the near voidless composite material 300. Note that the vacuum mixture 500 is shown for exemplary purposes only; other types of vacuum mixers may be used to generate the composite material 300 in other embodiments.

ambient temperatures. This feature eliminates the requirement to throttle, reduce the operating speed of the processor chip 109.

The composite material 300 has many applications as a conformal coating and as a tamper-proof coating. It can be made conductive or non-conductive, composite material 300 can be customized to possess almost any characteristic, all while shielding electronics from environmental factors. The composite material 300 can also be layered to possess different characteristics throughout its thickness.

The composite material 300 does not demand any special masking techniques other than that which is required to prevent material flow into areas that should not be coated. The composite material 300 does not require electronics to be cleaned or prepped in any manner other than that which is acceptable and/or necessary for proper performance of the electronics. Electronics can be dipped directly into the composite material 300, or completely entombed, in applications where masking is not needed.

Due to its nature, the composite material 300 is extremely tough and cannot be removed without damaging the substrate. Electrical and electronic components 104-110 (FIG. 1) encased in the composite material will remain there forever. Consequently, performance and projected maintenance requirements must be taken into consideration when using the composite material 300. Various characteristics of the composite material 300 can be pros or cons depending on the application.

Note that the composite material 300 may be made using other different processes in other embodiments.

What is claimed is:

1. A system, comprising:
   a printed circuit board (PCB) comprising one or more electrical and/or electronic components and a heat sink having fins for dissipating heat generated by operation of the electrical and/or electronic components, the fins extending upward from an upper surface of the PCB; and
   a composite material comprising epoxies, polyester, polyurethane, or silicone, and thermally-resistant solids, the composite material adhered to the PCB, encasing the one or more electrical or electronic components; and
   wherein portions of the fins of the heat sink extend above a top surface of the composite material.

2. The system of claim 1, wherein input/output (I/O) components are not encased in the composite material.

3. The system of claim 1, wherein the heat is guided by the composite material and away from the PCB through the heat sink.

4. The system of claim 1, wherein the heat is dissipated through the composite material.

5. The system of claim 1, wherein the composite material renders the PCB tamper resistant.

6. The system of claim 1, wherein the composite material makes the PCB free from intrusion.

7. The system of claim 1, wherein the composite material eliminates vibration of electrical or electronic components on the PCB.

8. The system of claim 1, wherein the composite material reduces and/or eliminates corrosion of electrical and/or electronic components on the PCB.

9. The system of claim 1, wherein the composite material reduces radiation exposure for the PCB.

10. The system of claim 1, wherein the composite material is lightweight.

11. The system of claim 1, wherein the composite material provides thermal protection to the PCB.

12. The system of claim 1, wherein the composite material provides electrical isolation properties to the PCB.

13. The system of claim 1, wherein the composite material provides toughness to the PCB.

14. The system of claim 1, wherein the composite material makes the one or more electrical and/or electronics on the PCB run cooler.

15. The system of claim 1, wherein the composite material is electrically non-conductive.

* * * * *